United States Patent [19]
Yeh et al.

[11] Patent Number: 5,712,753
[45] Date of Patent: Jan. 27, 1998

[54] METHOD FOR PREVENTING ELECTROSTATIC DISCHARGE FAILURE IN AN INTEGRATED CIRCUIT PACKAGE

[75] Inventors: Yang-Sen Yeh, Taipei; Ta-Lee Yu; Kow-Liang Wen, both of Hsinchu, all of Taiwan

[73] Assignee: Winbond Electronics Corp., Hsinchu, Taiwan

[21] Appl. No.: 643,355

[22] Filed: May 6, 1996

[51] Int. Cl.$^6$ ...................................................... H02H 3/22
[52] U.S. Cl. ............................ 361/56; 361/111; 361/220
[58] Field of Search ............................ 361/56, 91, 111, 361/212, 220; 257/491

[56] References Cited

U.S. PATENT DOCUMENTS

| | | |
|---|---|---|
| 4,819,047 | 4/1989 | Gilfeather et al. ............... 361/56 X |
| 4,870,530 | 9/1989 | Hurst et al. ............... 361/91 |
| 4,878,145 | 10/1989 | Lace ............... 361/118 |
| 5,012,317 | 4/1991 | Rountre ............... 361/56 X |
| 5,034,845 | 7/1991 | Murakami ............... 361/56 |
| 5,159,518 | 10/1992 | Roy ............... 361/56 |
| 5,515,225 | 5/1996 | Gen et al. ............... 361/56 |

Primary Examiner—Jeffrey A. Gaffin
Assistant Examiner—Michael Sherry
Attorney, Agent, or Firm—Fish & Richardson P.C.

[57] ABSTRACT

An integrated circuit package includes a semiconductor chip, bonding pads on the semiconductor chip, a plurality of wired pins wire-bonded respectively to the bonding pads, and at least one non-wired pin. The non-wired pin is connected electrically to an adjacent one of the wired pins to prevent electrostatic discharge failure in the integrated circuit package due to electrostatic discharge stressing of the non-wired pin.

7 Claims, 3 Drawing Sheets

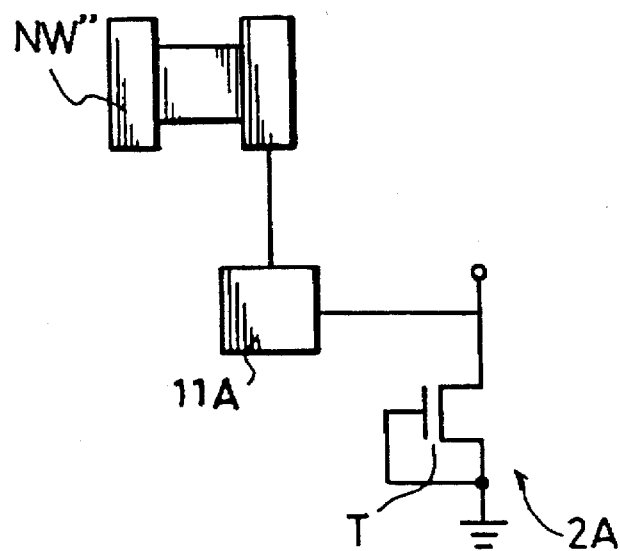
F I G. 3
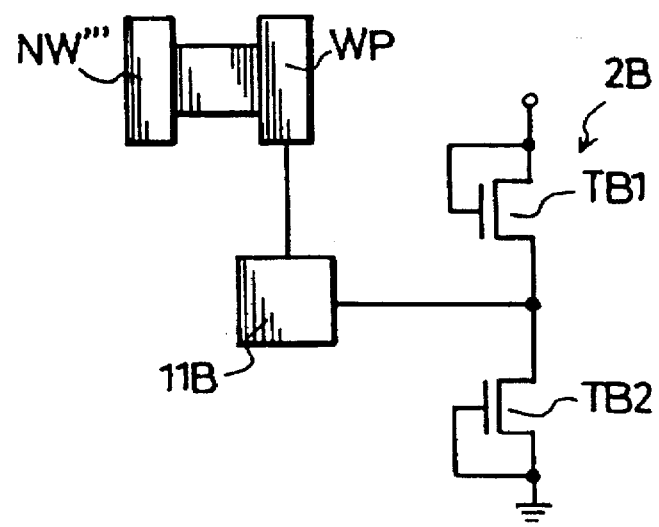
F I G. 4

METHOD FOR PREVENTING ELECTROSTATIC DISCHARGE FAILURE IN AN INTEGRATED CIRCUIT PACKAGE

CROSS REFERENCE TO RELATED APPLICATIONS

U.S. Ser. No. 08/642,194, entitled "Method for Preventing ESD Prevention Failure in an Integrated Circuit Package" filed May 5, 1996.

BACKGROUND OF THE INVENTION

1. Field of the Invention

This invention relates to an integrated circuit, more particularly to a method for preventing electrostatic discharge failure in an integrated circuit package.

2. Description of the Related Art

The trend of very large-scale integrated (VLSI) circuit packages is toward smaller dimension and higher density. Also, VLSI circuit packages make rapid progress to high pin counts and narrow pin pitch with increasing input/output signals by the trend of higher integrated function. With the increasing of pin count, the possibility of suffer from electrostatic discharge (ESD) failure, which is due to electrostatic discharge stressing of the non-wired pin of the integrated circuit package, is increasing. Therefore, the ESD is considered a major reliability threat to integrated circuit technologies. However, little attention has been paid to the destruction mechanism of non-wired pin so far. Thus, there is a need to provide a method which can prevent electrostatic discharge failure in an integrated circuit package.

SUMMARY OF THE INVENTION

The main objective of the present invention is to provide a method for preventing electrostatic discharge failure in an integrated circuit package.

According to the present invention, a method is provided for preventing electrostatic discharge failure in an integrated circuit package. The integrated circuit package includes a semiconductor chip, bonding pads on the semiconductor chip, a plurality of wired pins wire-bonded respectively to the bonding pads, and at least one non-wired pin. The electrostatic discharge failure is due to electrostatic discharge stressing of the non-wired pin. The method comprises the step of connecting electrically the non-wired pin to an adjacent one of the wired pins.

BRIEF DESCRIPTION OF THE DRAWINGS

Other features and advantages of the present invention will become apparent in the following detailed description of the preferred embodiment, with reference to the accompanying drawings, of which:

FIG. 3 is a schematic circuit diagram illustrating another electrostatic discharge protection device connected to the non-wired pin of the integrated circuit package;

FIG. 4 is a schematic circuit diagram illustrating another electrostatic discharge protection device connected to the non-wired pin of the integrated circuit package;

DETAILED DESCRIPTION OF THE PREFERRED EMBODIMENT

Figure 1:
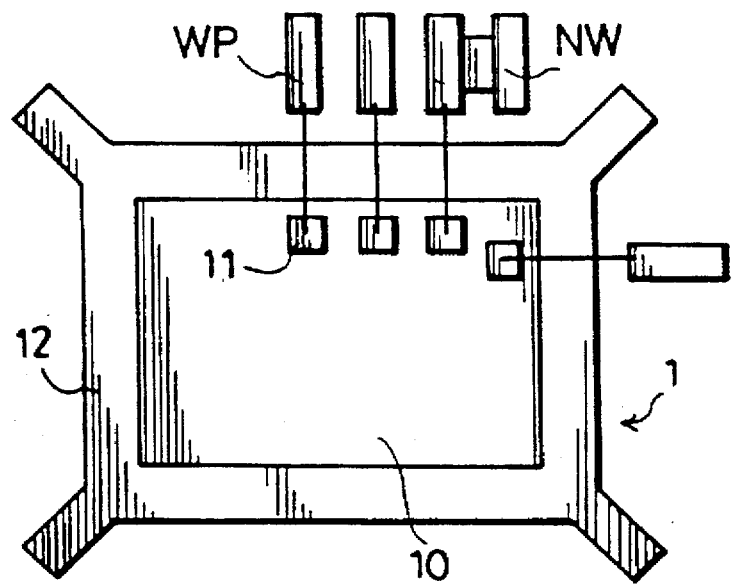
FIG. 1 is a schematic plan view illustrating the connection between a wired pin and a non-wired pin of an integrated circuit package in accordance with the present invention.

FIG. 1 shown an integrated circuit package 1 which includes a semiconductor chip 10, bonding pads 11 on the semiconductor chip 10, a metal lead frame 12 contacting electrically with the semiconductor chip 10, a plurality of wired pins (WP) wire-bonded respectively to the bonding pads 11, and at least one non-wired pin (NW).

Figure 2:
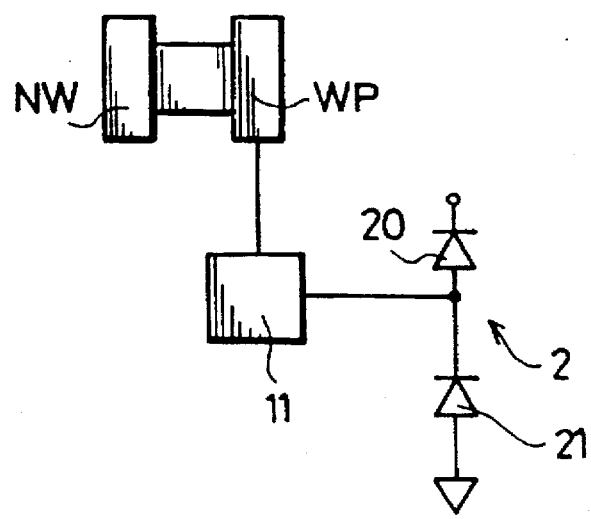
FIG. 2 is a schematic circuit diagram illustrating an electrostatic discharge protection device connected to the non-wired pin of the integrated circuit package.

In the method of the present invention, the non-wired pin (NW) is connected electrically to an adjacent one of the wired pins (WP). As best shown in FIG. 2, the bond pad 11 to which said adjacent one of the wired pins (WP) is connected electrically, is further connected electrically to an electrostatic-discharge protection device 2 so as to discharge the current that results from electrostatic discharge stressing of the non-wired pin (NW). The electrostatic-discharge protection device 2 includes a first diode (20) and a second diode (21). The first diode (20) has an anode connected electrically to the bonding pad 11 and a cathode connected electrically to a positive power source. The second diode 21 has a grounded anode and a cathode connected electrically to the anode of the first diode 20. Since the current that results from electrostatic discharge stressing of the non-wired pin (NW) is discharged through the protection device 2, destruction of the adjacent wired pin (WP) that is adjacent to the non-wired pin (NW) and that is caused by the ESD stressing to the non-wired pin (NW) is thus prevented.

FIG. 3 shows the relationship between another type of electrostatic discharge protection device (2A) and the non-wired pin (NW") of the integrated circuit package. The protection device (2A) of FIG. 3 includes a field effect transistor (T) having a drain connected electrically to a positive power source and the bonding pad (11A), a grounded source and a gate connected electrically to the grounded source thereof.

FIG. 4 shows the relationship between another type of electrostatic discharge protection device (2B) and the non-wired pin (NW'") of the integrated circuit package. The protection device. (2B) of FIG. 4 includes a first field effect transistor (TB1) having a drain connected electrically to a positive power source, a source connected electrically to the bonding pad (11B) and a gate connected electrically to the drain thereof, and a second field effect transistor (TB2) having a drain connected electrically to the source of the first field effect transistor (TB1), a grounded source and a gate connected electrically to the grounded source thereof.

Figure 5:
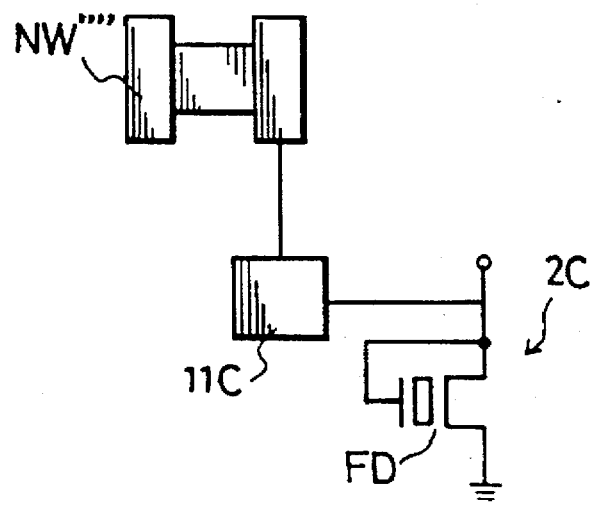
FIG. 5 is a schematic circuit diagram illustrating another electrostatic discharge protection device connected to the non-wired pin of the integrated circuit package.

FIG. 5 shows the relationship between another type of electrostatic discharge protection device (2C) and the non-wired pin (NW"") of the integrated circuit package. The protection device (2C) of FIG. 5 includes a field device (FD) having a drain connected electrically to a positive power source and the bonding pad (11C), a grounded source and a gate connected electrically to the drain thereof.

Figure 6:
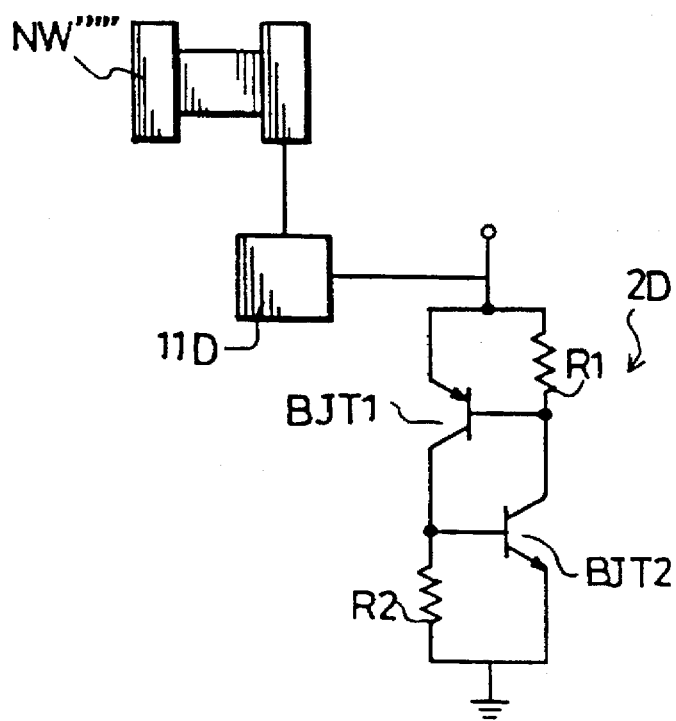
FIG. 6 is a schematic circuit diagram illustrating another electrostatic discharge protection device connected to the non-wired pin of the integrated circuit package.

FIG. 6 shows the relationship between another type of electrostatic discharge protection device (2D) and the non-wired pin (NW""') of the integrated circuit package. The electrostatic discharge protection device (2D) of FIG. 6 includes a silicon-controlled-rectifier. The silicon-controlled-rectifier includes a first transistor (BJT1) having an emitter connected electrically to the bonding pad (11D) and a positive power source, a base adapted to be connected electrically to the positive power source via a first resistor (R1), and a collector, and a second transistor (BJT2) having a collector connected electrically to the base of the first transistor (BJT1), a base connected electrically to the collector of the first transistor (BJT1), and a grounded emitter connected electrically to the base thereof via a second resistor (R2).

While the present invention has been described in connection with what is considered the most practical and preferred embodiment, it is understood that this invention is not limited to the disclosed embodiment, but is intended to cover various arrangements included within the spirit and scope of the broadest interpretation so as to encompass all such modifications and equivalent arrangements.

We claim:

1. A method for preventing electrostatic discharge failure in an integrated circuit package which includes a semiconductor chip, bonding pads on the semiconductor chip, a plurality of wired pins wire-bonded respectively to the bonding pads, and at least one non-wired pin, the electrostatic discharge failure being due to electrostatic discharge stressing of the non-wired pin, said method comprising the step of:

connecting electrically the non-wired pin to an adjacent one of the wired pins.

2. A method as claimed in claim 1, further comprising the step of connecting electrically an electrostatic-discharge protection device to one of the bonding pads to which said adjacent one of the wired pins is wire-bonded for discharging of current that results from electrostatic discharge stressing of the non-wired pin.

3. A method as claimed in claim 2, wherein said electrostatic-discharge protection device includes a first diode having an anode connected electrically to said one of the bonding pads and a cathode connected electrically to a positive power source, and a second diode having a grounded anode and a cathode connected electrically to said anode of said first diode.

4. A method as claimed in claim 2, wherein said protection device includes a field effect transistor having a drain connected electrically to a positive power source and said one of the bonding pads, a grounded source and a gate connected electrically to said grounded source thereof.

5. A method as claimed in claim 2, wherein said protection device includes a first field effect transistor having a drain connected electrically to a positive power source, a source connected electrically to said one of the bonding pads and a gate connected electrically to said source thereof, and a second field effect transistor having a drain connected electrically to said source of said first field effect transistor, a grounded source and a gate connected electrically to said grounded source thereof.

6. A method as claimed in claim 2, wherein said protection device includes a field device having a drain connected electrically to a positive power source and said one of the bonding pads, a grounded source and a gate connected electrically to said drain thereof.

7. A method as claimed in claim 2, wherein said protection device includes a first transistor having an emitter connected electrically to said one of the bonding pads and a positive power source, a base connected electrically to the positive power source via a first resistor, and a collector, and a second transistor having a collector connected electrically to said base of said first transistor, a base connected electrically to said collector of said first transistor, and a grounded emitter connected electrically to said base thereof via a second resistor.

* * * * *